US010187977B2

(12) United States Patent
Markovsky et al.

(10) Patent No.: US 10,187,977 B2
(45) Date of Patent: Jan. 22, 2019

(54) HEAD MOUNTED COMPUTING DEVICE, ADHESIVE JOINT SYSTEM AND METHOD

(71) Applicant: MICROSOFT TECHNOLOGY LICENSING, LLC, Redmond, WA (US)

(72) Inventors: Igor Markovsky, Redwood City, CA (US); Michael Nikkhoo, Saratoga, CA (US); Andriy Pletenetskyy, Mountain View, CA (US); Erin Hurbi, San Francisco, CA (US)

(73) Assignee: MICROSOFT TECHNOLOGY LICENSING, LLC, Redmond, WA (US)

(*) Notice: Subject to any disclaimer, the term of this patent is extended or adjusted under 35 U.S.C. 154(b) by 362 days.

(21) Appl. No.: 14/754,413

(22) Filed: Jun. 29, 2015

(65) Prior Publication Data
US 2016/0381790 A1 Dec. 29, 2016

(51) Int. Cl.
*H05K 1/02* (2006.01)
*G02B 27/01* (2006.01)
(Continued)

(52) U.S. Cl.
CPC ....... *H05K 1/0284* (2013.01); *G02B 27/0172* (2013.01); *G06F 3/012* (2013.01);
(Continued)

(58) Field of Classification Search
CPC .......... H05K 2201/10151; H05K 2201/10757; H05K 2201/10848; G01C 19/00; G01P 1/00; G01P 1/023; G01P 15/125
(Continued)

(56) References Cited

U.S. PATENT DOCUMENTS 5,051,870 A 9/1991 Pagaila
5,343,748 A 9/1994 Mozgowiec et al.
(Continued)

FOREIGN PATENT DOCUMENTS

EP 0523862 A1 1/1993
EP 0675363 A2 10/1995
(Continued)

OTHER PUBLICATIONS

ISA European Patent Office, International Search Report and Written Opinion Issued in PCT Application No. PCT/US2016/037465, dated Sep. 13, 2016, WIPO, 11 Pages.
(Continued)

*Primary Examiner* — Tuan T Dinh
(74) *Attorney, Agent, or Firm* — Alleman Hall Creasman & Tuttle LLP

(57) ABSTRACT

An adhesive joint system comprises a circuit board with a distal end and a proximal end mounted on a first side via a tongue and groove connection to a housing. An adhesive is positioned at least in the gap surrounding the tongue, and an electrical component mounted to the distal end on a second side of the circuit board that is opposite the first side. The respective coefficients of thermal expansion (CTE) of the tongue, adhesive, and the material defining the groove are related, such that as heat is applied to the tongue and groove connection, the adhesive is compressed within the gap.

18 Claims, 10 Drawing Sheets

(51) Int. Cl.
| | |
|---|---|
| *G06F 3/01* | (2006.01) |
| *G06T 19/00* | (2011.01) |
| *H05K 3/00* | (2006.01) |
| *H05K 3/30* | (2006.01) |
| *H05K 3/46* | (2006.01) |
| *H05K 5/00* | (2006.01) |
| *H05K 3/06* | (2006.01) |

(52) U.S. Cl.
CPC ......... *G06T 19/006* (2013.01); *H05K 1/0271* (2013.01); *H05K 3/0058* (2013.01); *H05K 3/061* (2013.01); *H05K 3/303* (2013.01); *H05K 3/4688* (2013.01); *H05K 5/0078* (2013.01); *G02B 2027/0174* (2013.01); *G02B 2027/0178* (2013.01); *H05K 2201/068* (2013.01); *H05K 2201/09081* (2013.01); *H05K 2201/10969* (2013.01); *H05K 2201/10984* (2013.01); *H05K 2203/0228* (2013.01); *H05K 2203/068* (2013.01)

(58) Field of Classification Search
USPC ......... 361/760–784, 700–710, 752, 803, 807
See application file for complete search history.

(56) References Cited

U.S. PATENT DOCUMENTS

| | | | |
|---|---|---|---|
| 5,345,823 | A | 9/1994 | Reidemeister et al. |
| 6,412,346 | B2 | 7/2002 | Barkai et al. |
| 6,474,159 | B1 | 11/2002 | Foxlin et al. |
| 6,578,682 | B2 | 6/2003 | Braman et al. |
| 6,859,751 | B2 | 2/2005 | Cardarelli |
| 6,987,304 | B2 | 1/2006 | DCamp et al. |
| 7,004,107 | B1 | 2/2006 | Raoux et al. |
| 7,234,352 | B2 * | 6/2007 | Mitani ............... G01C 19/5628 439/76.2 |
| 7,345,365 | B2 | 3/2008 | Lee et al. |
| 7,529,154 | B2 | 5/2009 | Cole et al. |
| 7,733,667 | B2 * | 6/2010 | Qin ....................... H05K 7/142 174/138 E |
| 8,080,925 | B2 | 12/2011 | Berger et al. |
| 8,110,917 | B2 | 2/2012 | Hirose et al. |
| 8,183,077 | B2 | 5/2012 | Vaganov et al. |
| 8,412,393 | B2 | 4/2013 | Anderson et al. |
| 8,530,274 | B2 | 9/2013 | Pagaila |
| 8,583,392 | B2 | 11/2013 | Panagas |
| 8,766,099 | B2 | 7/2014 | Yeates |
| 2007/0090475 | A1 | 4/2007 | Karnick et al. |
| 2008/0197514 | A1 | 8/2008 | Goida |
| 2011/0006611 | A1 * | 1/2011 | Baarman ................ H01F 38/14 307/104 |
| 2011/0139987 | A1 | 6/2011 | Kromer |
| 2013/0343015 | A1 * | 12/2013 | Malek ................ H05K 7/1417 361/752 |
| 2014/0035071 | A1 | 2/2014 | Chen et al. |
| 2014/0063753 | A1 | 3/2014 | Chino |
| 2014/0208823 | A1 | 7/2014 | Trusov et al. |
| 2014/0217566 | A1 | 8/2014 | Goida et al. |

FOREIGN PATENT DOCUMENTS

| | | |
|---|---|---|
| EP | 0908363 A2 | 4/1999 |
| FR | 2933567 A1 | 1/2010 |
| JP | 2001298277 A | 10/2001 |
| KR | 1020130049996 A | 5/2013 |
| WO | 2009016114 A1 | 2/2009 |

OTHER PUBLICATIONS

Aizzuddin, A. et al., "Obtaining Translation from a 6-DOF MEMS IMU—an Overview," Proceedings of the 2007 Asia-Pacific Conference on Applied Electromagnetics (APACE 2007), Dec. 4, 2007, Melaka, Malaysia, 5 pages.

Wu, Yinan et al., "Pedestal Mounting of Sensor System," U.S. Appl. No. 14/754,439, filed Jun. 9, 2015, 22 pages.

Yoon, et al., "Analysis and wafer-level design of a high-order silicon vibration isolator for resonating MEMS Devices" In Journal of Micromechanics and Microengineering, Dec. 22, 2010, 12 pages.

ISA European Patent Office, International Search Report and Written Opinion Issued in Application No. PCT/US2016/037466, dated Oct. 14, 2016, WIPO, 11 Pages.

IPEA European Patent Office, International Preliminary Report on Patentability Issued in PCT Application No. PCT/US2016/037466, dated Jun. 19, 2017, WIPO, 7 Pages.

* cited by examiner

HEAD MOUNTED COMPUTING DEVICE, ADHESIVE JOINT SYSTEM AND METHOD

BACKGROUND

An electronic device may include various sensors to provide input for device functionalities. Examples include, but are not limited to, motion sensors such as accelerometers and gyroscopes that are mounted onto a circuit board of the device. The electronic device may further include an adhesive joint system to adhere the circuit board to a housing. Repeated temperature fluctuations may cause expansion and contraction of materials in the housing, adhesive joint system, and circuit board, which can induce stresses in these components and cause relative movement between the sensors and housing. Such stresses and movements can negatively affect performance of the electronic device.

SUMMARY

Adhesive joint systems and their methods of manufacture are disclosed. According to one aspect, the adhesive joint system may include a circuit board including a distal end and a proximal end mounted on a first side via a tongue and groove connection to a housing, the tongue and groove connection includes a tongue and a groove and a gap between the tongue and the groove. An adhesive is positioned at least in the gap surrounding the tongue, and an electrical component is mounted to the distal end on a second side of the circuit board that is opposite the first side. Respective coefficients of thermal expansion (CTE) of the tongue, adhesive, and the material defining the groove are related such that, as heat is applied to the tongue and groove connection, the adhesive is compressed within the gap.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

The inventors have recognized that printed circuit boards containing sensor packages, such as gyroscopes and accelerometers, may be sensitive to external stresses and movements arising from temperature-induced expansion and contraction of the materials to which the sensors are mounted. Temperature-induced stresses may arise, for example, from a mismatch between a coefficient of thermal expansion (CTE) of a circuit board, a sensor package mounted to the circuit board, and an adhesive that attaches the circuit board to a housing. This may lead to structural destabilization of the adhesive, particularly when the adhesive is loaded in tension, since the tensile and shear strengths of adhesives are typically significantly weaker than their compressive strength.

Heat and temperature fluctuations that cause such expansion and contraction may arise from various sources. For example, the electronic device in which an adhesive joint system is incorporated may be used in different ambient temperatures during normal usage. Also, components inside the electronic device may generate heat and cause additional temperature fluctuations, which contribute to thermal loading in addition to ambient temperature conditions. As the electronic device experiences multiple cycles of temperature fluctuations over time, the position of the sensor package and circuit board relative to the housing may gradually shift, leading to undesired changes in the functioning of the sensors.

While in certain low precision applications in which tracking of a device need only be accurate to within a meter for example, such movements may be tolerable, in high precision applications in which centimeter scale, millimeter scale, or finer precision of tracking is desired, sensors of very high precision are used to ensure accurate head motion tracking. One example of such an application is augmented-reality head mounted computing devices which track user head motion and display holograms to a user based on the tracked head motion. Even slight errors in the estimated head position can cause the displayed holograms to appear in the wrong location or to waver in position relative to the real environment viewed through the see-through display of the head mounted device, and these visual side-effects of the tracking errors can be unsettling to the user.

Figure 1:
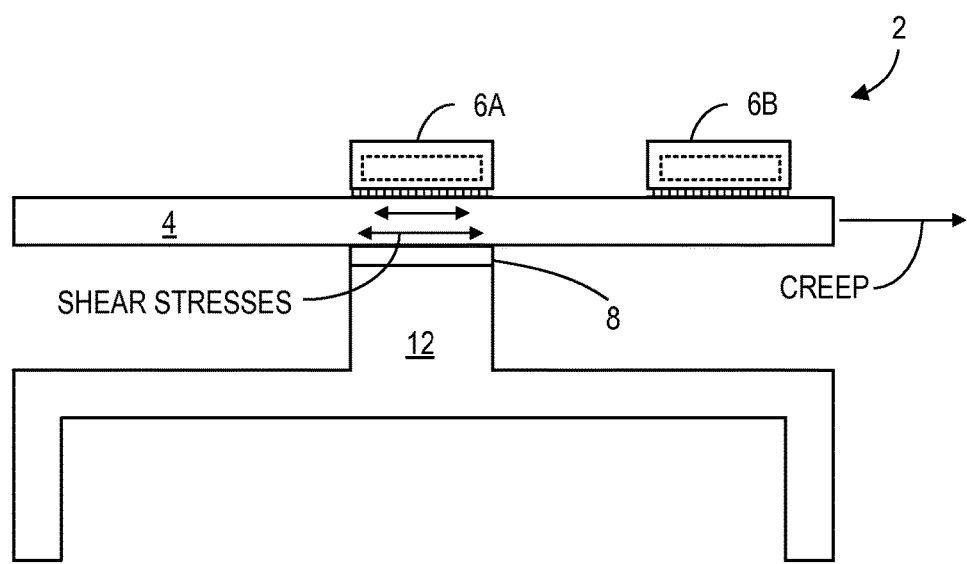
FIG. 1 is a cross sectional view of a face to face glue joint.

Referring to FIG. 1, the inventors have discovered that one type of adhesive joint that is particularly susceptible to such problems is a face-to-face glue joint (FTFGJ) 2, in which a printed circuit board 4 having a sensor package 6A, 6B on a top side is mounted on its bottom side via an adhesive 8 to an upper surface of a housing 12. Under thermal loading, as temperatures rise, the printed circuit board 4, sensor package 6A, 6B, adhesive 8, and housing 12 all attempt to expand, with the expansion of each occurring according to its respective CTE. In one example, the inventors observed that an adhesive 8 with higher CTE than the housing 12 and printed circuit board 4, (1) induced thermal shear stresses at the interface between the adhesive 8 and the printed circuit board 4 due to the printed circuit board 4 attempting to expand less than the adhesive 8 to which it was bonded, in which shear stresses could be transmitted through the printed circuit board 4 to the sensor package 6A mounted on the top side, and (2) the expansion of the adhesive 8 in the joint caused the entire printed circuit board 4 to move laterally relative to the housing 12, which affected the relative positions of both sensor packages 6A, 6B relative to the housing. Indeed, over time and repeated temperature fluctuations, the cumulative effect of small transpositions due to greater expansion of the adhesive than the printed circuit board caused linear creep to occur in the position of the printed circuit board relative to the housing. Such stresses and movements were found to degrade the accuracy of sensor measurements.

To address these issues, the inventors conceived of the embodiments disclosed herein, which, as will be discussed below, may have the potential advantage of mitigating the gradual movement of the sensor packages, circuit board, and the housing arising from a mismatch in CTE over multiple cycles of temperature fluctuations, and minimize the transfer of stress from the circuit board to the sensor packages. Briefly, an example adhesive joint system of the present disclosure includes a groove, a tongue, and adhesive positioned within the groove in the gap surrounding the tongue, when the tongue fits into the groove to form a connection between the circuit board and the housing. The respective CTEs of the tongue, groove, and adhesive are configured such that, as the device experiences a cycle of temperature fluctuation, thermal expansion of the three components results in the compression of the adhesive within the gap. Accordingly, much of the stress arising from the cycle of temperature fluctuation is converted into the compressive force of the adhesive in a radial direction while reducing the shear force that is applied on the adhesive. This inhibits the ability of the adhesive to shift the position of the circuit board relative to the housing, thereby also reducing the potential for movement of the sensor packages relative to the housing. To reduce the impact of stress applied via the tongue and groove connection, the sensor package is mounted on the opposite side of the circuit board, away from the first side mounting the tongue and groove connection.

The configurations described herein may be used for any electronic device that has electronic components mounted onto a circuit board that is adhered to a housing, and is particularly suited for sensors that may be sensitive to thermally induced shear stresses and movement, and that are exposed to repeated rounds of thermal cycling. Example sensors that may be mounted onto the circuit board in the adhesive joint system include but are not limited to inertial motion sensors, pressure sensors, image sensors, resonators, filters, and other types of sensors. In one embodiment, the electronic device may be a head mounted computing device of the type shown in FIG. 6, described below. While the below examples are described with respect to an adhesive joint system having one or more electronic components, it will be understood that the electronic components may comprise the above sensors as well as other sensors without departing from the scope of the disclosure.

Figure 6:
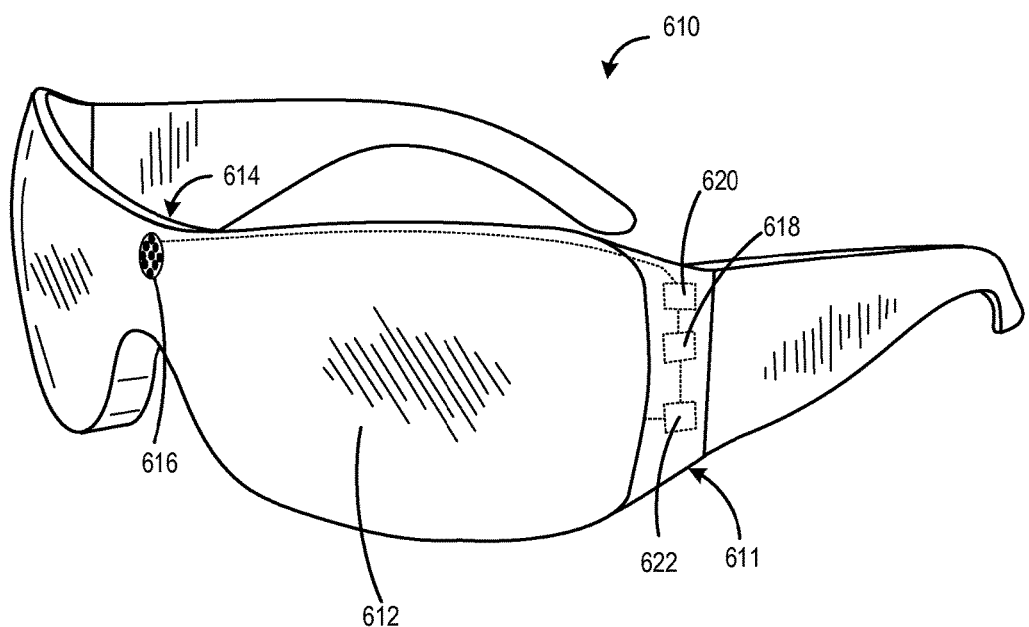
FIG. 6 is a perspective view of an example head mounted computing device into which the adhesive joint system of FIGS. 2A-4C may be incorporated.

An adhesive joint system may be incorporated into any suitable precision electronic device. Examples include, but are not limited to, wearable computing devices such as head-mounted computing devices as shown in FIG. 6, other wearable computers, mobile devices, tablet computers, laptop computers, machines incorporating computing devices (e.g. automobiles), unmanned aerial vehicles (UAVs), aircraft navigation systems, and attitude and heading reference systems (AHRS).

Figure 2A:
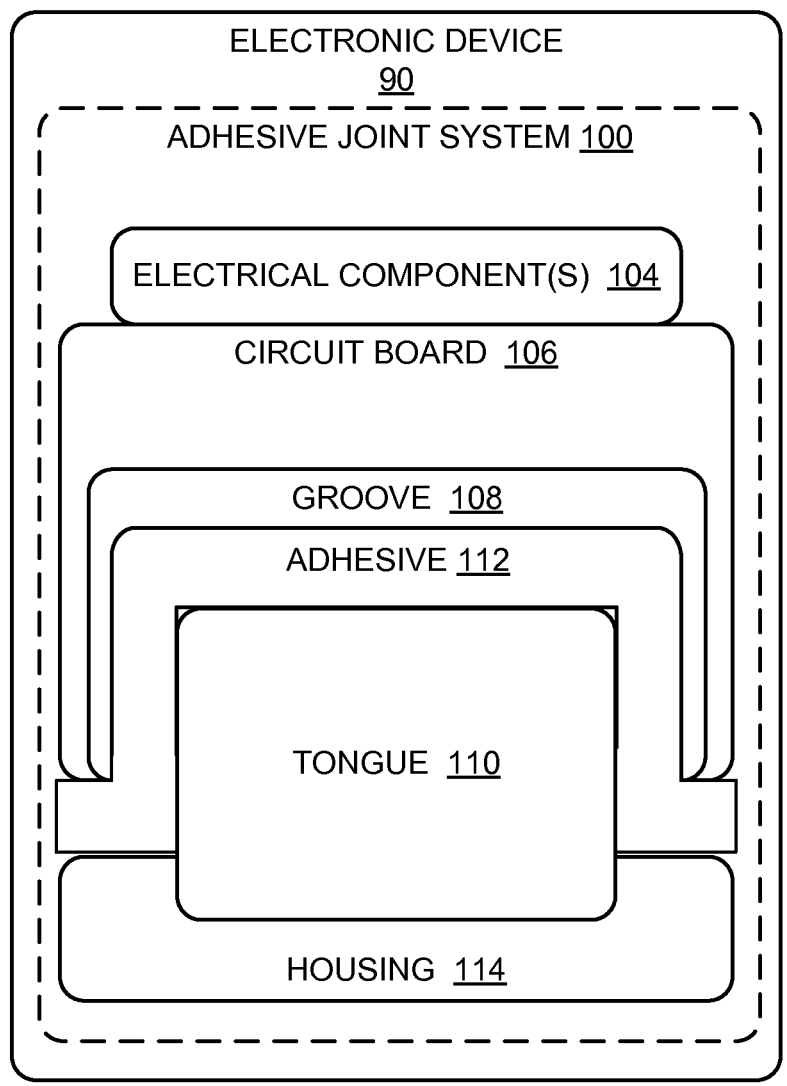
FIG. 2A shows a schematic diagram of an adhesive joint system according to a first exemplary embodiment of the present disclosure.

FIG. 2A shows a schematic diagram of a first embodiment of an adhesive joint system 100 configured to be incorporated into an electronic device 90. The adhesive joint system 100 comprises a circuit board 106 mounted on a first side via a tongue 110 and groove 108 connection to a housing 114. An adhesive 112 is positioned in the groove. The tongue 110 extends from the housing 114 into the groove 108, and the material defining the groove 108 is in the circuit board 106. An electrical component 104 is mounted to the distal end of the circuit board 106 that is opposite the first side.

Figure 2B:
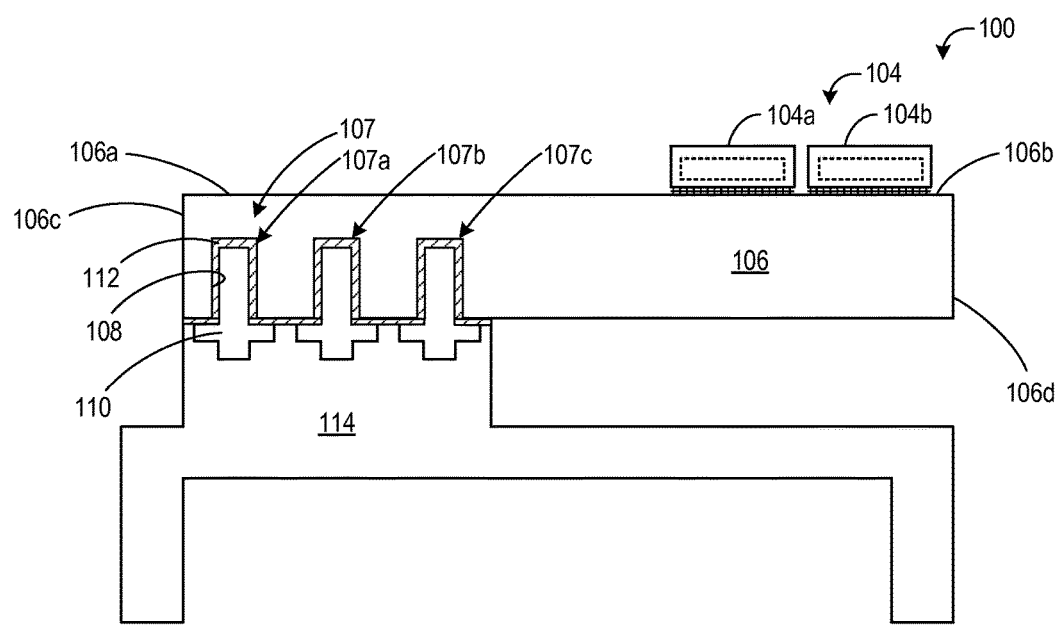
FIG. 2B shows a cross-sectional view of an adhesive joint system according to the first exemplary embodiment of the present disclosure.

Referring to FIG. 2B, a more detailed, cross-sectional view of the adhesive joint system 100 of the present disclosure is shown according to the first embodiment. Circuit board 106 includes a distal end 106d and a proximal end 106c mounted on a first side 106a via a tongue and groove connection 107 including a tongue 110 and a groove 108 to a housing 114. The material comprising the printed circuit board 106 is not particularly limited, and may include FR-4, which is a flame retardant composite material that is composed of woven fiberglass cloth with an epoxy binder that is flame resistant. The tongue and groove connection 107 includes a gap coextensive with the shaded region between the tongue 110 and the groove 108. The borders of the gap are roughly defined by the external perimeter of the tongue 110 and the interior perimeter of the groove 108. An adhesive 112 is positioned at least in the gap surrounding the tongue 110 in the groove 108. In the depicted embodiment, the adhesive is also positioned in a gap between the bottom horizontal surface of the circuit board 106 and the top horizontal surface of the housing 114. The surfaces defining the gap, such as the inner perimeter surface of the groove 108 and the outer perimeter surface of the tongue 110 may be chemically treated to add roughness, or coated with a chemical layer to improve adhesion between the adhesive 112 and the surfaces of the housing 114 and circuit board 106 that define the gap, to promote secure adhesion.

An electrical component 104 is mounted to the distal end 106d on a second side 106b of the circuit board 106 that is opposite the first side 106a. In some embodiments a plurality of electrical components may be provided, as illustrated at 104a and 104b. The electrical components 104 may be sensitive, precision electronic devices, such as an inertial motion sensor. The inertial motion sensor may comprise one of a gyroscope and an accelerometer. As illustrated, the mating surfaces of the circuit board 106 and housing 114 in the region of tongue and groove connection 107 may be configured to be substantially planar, but may adopt other configurations as well, such as inclines and curves having corresponding shapes.

As depicted in FIG. 2B, the material defining the groove 108 is in the circuit board 106. The tongue 110 is a pin that is coupled to the housing 114 and extends from the housing 114 into the groove 108. The tongue 110 may be formed integrally with the housing 114 as a single unitary member to reduce the number of components comprising the device and reduce costs, or formed as a component, such as a pin, that is distinct and separate from the housing 114. The pin may be mechanically secured to the housing by welding, soldering, brazing, threaded engagement, interference fit, or other means such as an adhesive. In view of the manufacturing process, a tongue formed as a pin having a cylindrical shape that is circular in cross section is advantageous for cost reduction, and may have threads on its outer circumference for engagement, but it will be appreciated that the cross sectional shapes of the tongue 110 and groove 108 are not particularly limited, and may comprise a variety of specially configured cross sectional shapes, such as ellipses, squares, rectangles, and the like, which interlock and inhibit rotation of the tongue relative to the groove. An interlocking fit between the tongue and the groove may be useful to inhibit rotational movement may otherwise be imparted under cyclic thermal loading, particular keeping in mind that in some embodiments only one tongue and groove connection 107 may be employed between the circuit board 106 and the housing 114, as discussed below.

In this embodiment, the housing is mounted on the first side 106a via a plurality of tongue and groove connections including the first tongue and groove connection. Alternatively, only one tongue and groove connection may be used. When a plurality of tongue and groove connections are provided, the precise number of such connections is not limited, and it will be appreciated that 2, 3, 4 or more of such connections may be employed. For example, in the depicted embodiment, a first tongue and groove connection 107a, a second tongue and groove connection 107b and a third tongue and groove connection 107c are illustrated as the plurality of tongue and groove connections 107. One potential advantage of providing a plurality of such tongue and groove connections 107 is that rotational movement between the circuit board 106 and housing 114 may be inhibited, even if circular pins are used. Another potential advantage is that expansion of the circuit board 106 relative to the housing 114 may be constrained over a larger area.

In accordance with this configuration, the CTE of the tongue 110, adhesive 112, and the material defining the groove 108 are related such that as heat is applied to the tongue and groove connection 107, the adhesive 112 is compressed within the gap. As the electronic device 90 is exposed to repeated rounds of thermal cycling during the manufacturing process and usage of the device, much of the shear stress in the joint arising from the thermal cycling is converted into compressive force acting on the adhesive 112 in the gap between groove 108 and tongue 110. This compressive force acts radially inwardly on the adhesive in the gap, compressing the adhesive in the gap, and ensuring a secure fit. As a result, the adhesive in the gap is not loaded in tension during thermal expansion of the housing 114 and circuit board 106, which is advantageous because the adhesive is generally stronger in compression than in tension. In one embodiment, if the CTE of the tongue 110 is configured to be larger than that of the adhesive 112 or the material defining the groove 108, the gap between the tongue 110 and the groove 108 is thought to shrink the most, and the adhesive 112 exerts the greatest magnitude of compression. On the other hand, in another embodiment, if the CTE of the adhesive 112 is configured to be larger than that of the tongue 110 or the material defining the groove 108, the gap between the tongue 110 and the groove 108 shrinks to a lesser extent, but the thermal expansion of the adhesive 112 is thought to exceed that of the tongue 110 and the groove 108, and the adhesive 112 still exerts a significant amount of compression. In either embodiment, the radial compression of the adhesive within the gap is achieved, resulting in a secure fit, and not loading the adhesive in the gap in tension during thermal expansion of the tongue and groove connection 107.

Figure 3A:
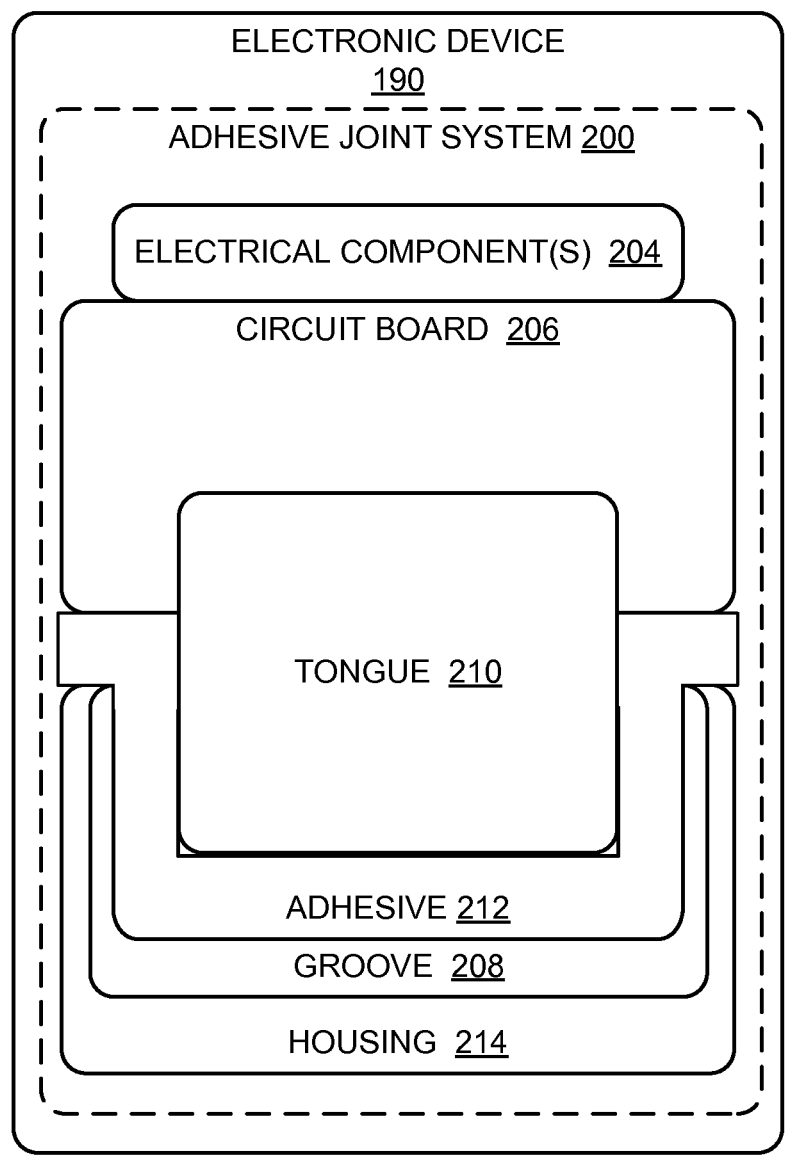
FIG. 3A shows a schematic diagram of an adhesive joint system according to a second exemplary embodiment of the present disclosure.
Figure 3B:
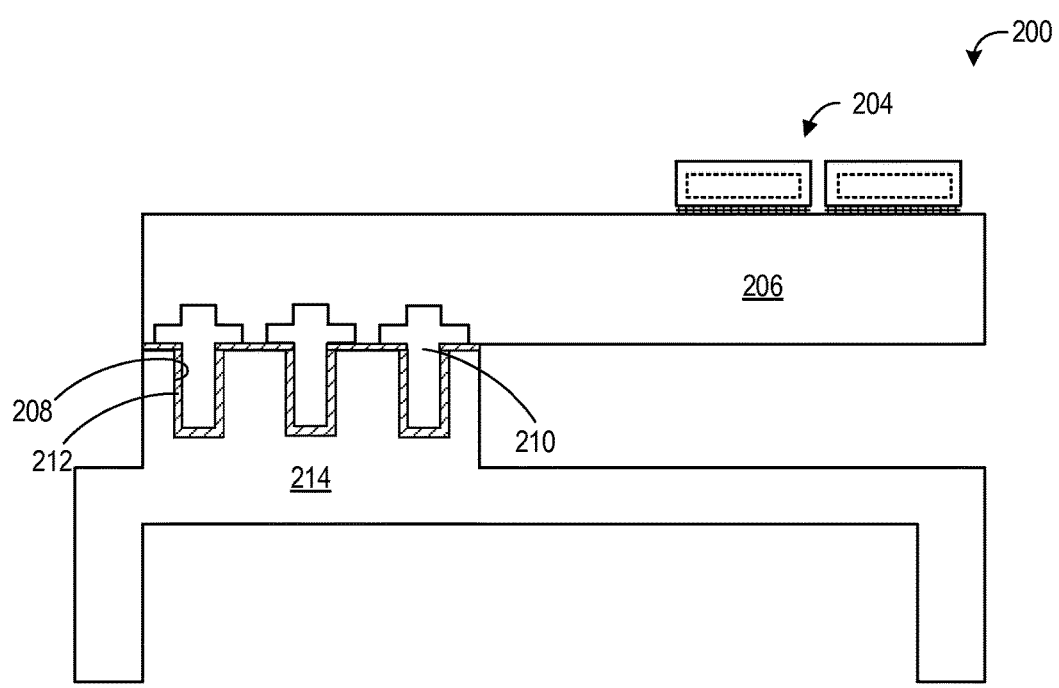
FIG. 3B shows a cross-sectional view of an adhesive joint system according to the second exemplary embodiment of the present disclosure.

Referring to FIG. 3A, a schematic diagram is shown of a second embodiment of an adhesive joint system 200 configured to be incorporated into an electronic device 190 for mounting electrical components 204 to a housing 214. FIG. 3B shows a more detailed, cross-sectional view of the adhesive joint system 200 according to the second embodiment. Since the structure of the second embodiment is generally similar to the first embodiment with the exception of the configurations of the tongue and the groove, the detailed description thereof is abbreviated here for the sake of brevity. It is to be noted that like parts are designated by like reference numerals throughout the detailed description and the accompanying drawings. As shown in FIGS. 3A and 3B, in contrast to the first embodiment, the tongue 210 extends from the circuit board 206 into the groove 208, and the material defining the groove 208 is in the housing 214. Thus, the groove 208 is formed in the housing 214 rather than in the circuit board 206 in this second embodiment. Likewise, in this embodiment, the tongue 210 may be a pin coupled to the circuit board 206. The tongue 210 may be formed integrally with the circuit board 206, or formed as a component that is distinct and separate from the circuit board 206, and coupled to the circuit board via one of the methods described above.

Figure 4A:
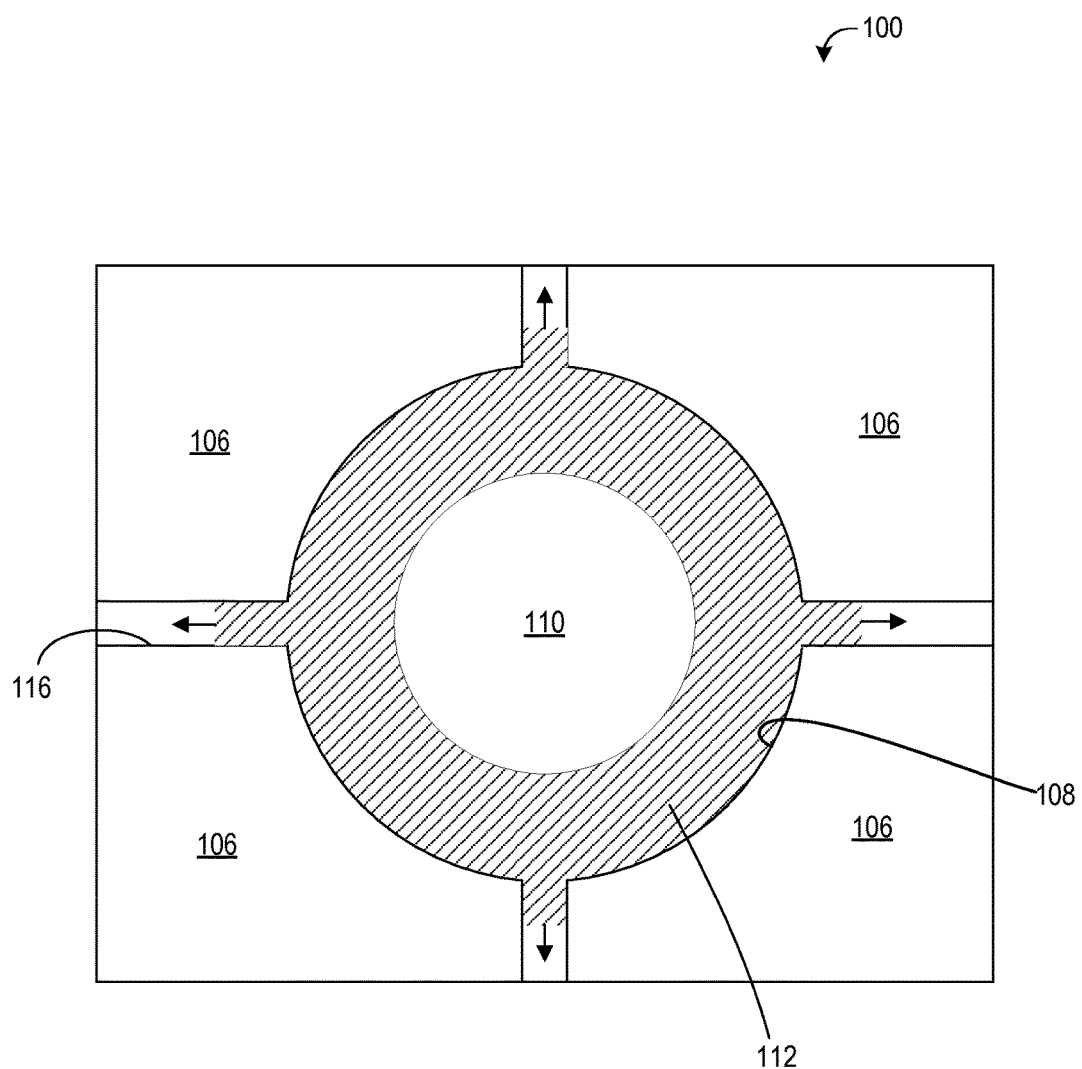
FIG. 4A shows a cross-sectional view of a tongue and groove connection and flow channels according to the first exemplary embodiment of the present disclosure.

Referring to FIG. 4A, a cross-sectional view of the first embodiment of the tongue 110 and groove 108 connection of the present disclosure is shown. The adhesive joint system 100 may further comprise a flow channel 116 that is contiguous with the groove 108 and configured to bleed adhesive 112 out of the groove 108 when the adhesive 112 is compressed in the groove 108 during a manufacturing process. In this view, the circuit board 106 has been mounted onto the housing 114, a tongue 110 and groove 108 connection has been formed with adhesive 112 disposed in the groove 108, and the adhesive 112 is confined to the groove 108 before the adhesive has cured during the manufacturing process, for example, by UV curing, thermal curing, etc. The arrows in the figure show the path of adhesive into the flow channel. This may be used to accommodate extra adhesive during the manufacturing process, so that the precise amount of adhesive need not be measured with great precision, and so that uncontrolled leakage of excess adhesive doesn't occur from other areas in the joint during assembly. Although most of the bleeding will occur during assembly prior to curing, when the adhesive flows more freely, it will be understood that some bleeding may occur after curing during thermal fluctuations as well. In addition, while four flow channels are configured in this Figure, the number of flow channels that are configured per groove 108 is not particularly limited there may be only one per groove, or a plurality of flow channels per groove other than four.

Figure 4B:
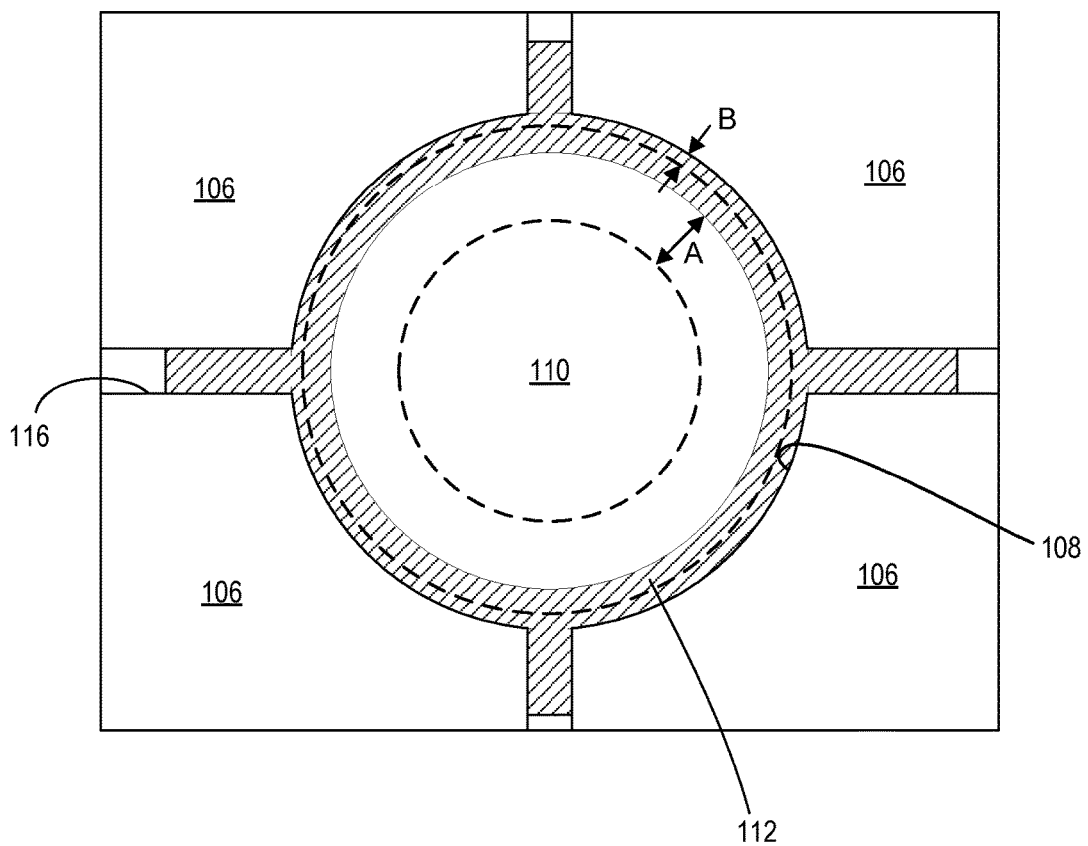
FIG. 4B shows a cross-sectional view of a tongue and groove connection and flow channels following the application of heat according to the first exemplary embodiment of the present disclosure.

Referring to FIG. 4B, another view of the first embodiment of the tongue 110 and groove 108 connection of the present disclosure is shown. In this embodiment, the CTE of the tongue 110 is configured to be greater than the CTE of the material defining the groove 108, such that as heat is applied to the tongue 110 and groove 108 connection, the gap between the tongue 110 and the groove 108 narrows, thereby compressing the adhesive 112 in the gap. In this view, the tongue 110 has expanded a distance A in response to absorbing heat during a cycle of temperature fluctuations, and the groove has expanded a distance B, and the adhesive, though wanting to expand due to heat, has actually been geometrically compressed and some has flowed into the flow channels 116. By expanding more than the adhesive 112 and more than the material defining the groove 108, the tongue compresses the adhesive 112 against the tongue 110 and the groove 108. Adhesive 112 is typically a compressible material, and thus can be geometrically compressed by these forces. Further, some portion of the adhesive 112 may bleed or flow out of the gap into a flow channel 116 provided contiguously with the groove 108 under the compressive forces. It will be appreciated that a similar configuration of flow channels and CTE of the adhesive, tongue and material defining the groove can also be applied to the second embodiment as well, so that the flow channels 116 and the groove 108 are configured in the housing instead of the circuit board 106. In accordance with this configuration, the flow channels can act to lessen the compressive force that is applied by the adhesive during a round of thermal cycling, especially as a compressive force that exceeds a certain threshold could undesirably weaken the adhesive properties of the adhesive 112. It will be appreciated that this is a schematic view with proportions exaggerated to illustrate the relationships of the expansion of the various components, and is not drawn to scale.

Figure 4C:
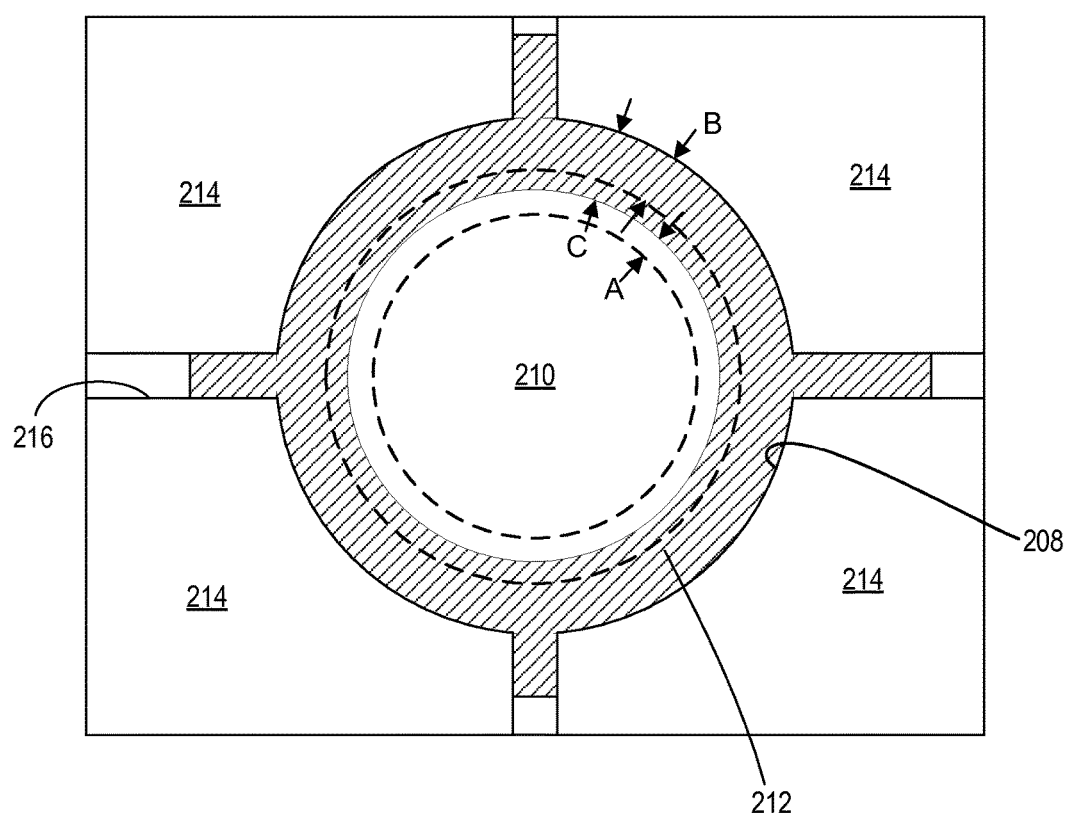
FIG. 4C shows a cross-sectional view of a tongue and groove connection and flow channels following the application of heat according to the second exemplary embodiment of the present disclosure.

Referring to FIG. 4C, a cross-sectional view of a second embodiment of the tongue 210 and groove 208 connection of the present disclosure is shown. Since the flow channel 216 structure of the second embodiment is generally similar to that of the first embodiment, the detailed description thereof is abbreviated here for the sake of brevity. It is to be noted that like parts are designated by like reference numerals throughout the detailed description and the accompanying drawings. In this embodiment, the CTE of the tongue 210 is configured to be less than the CTE of the material defining the groove 208, and the CTE of the adhesive 212 is configured to be greater than that of the groove 208 or the tongue 210, such that as heat is applied to the tongue 210 and groove 208 connection, the gap between the tongue 210 and the groove 208 expands less than the adhesive 212 expands, thereby compressing the adhesive 212 in the gap. In this view, the adhesive 212 has expanded a distance C in response to absorbing heat during a cycle of temperature fluctuations, while the tongue has expanded a distance A and the material defining the groove has expanded a distance B. In this state, the adhesive is still in compression and thus is trying to expand even more than it is able to due to the constraints of the groove and tongue surfaces. By expanding more than the tongue 210 or the material defining the groove 208, the adhesive 212 compresses against the tongue 210 and the groove 208, firmly securing the joint. Under the influence of these compressive forces, some of adhesive 212 may bleed out of the gap into flow channel 216 provided contiguously with the groove 208. It will be appreciated that a similar configuration of flow channels and CTE of the adhesive, tongue and material defining the groove can also be applied to the first embodiment as well, so that the flow channels and the groove are configured in the circuit board instead of the housing 214.

Figure 5:
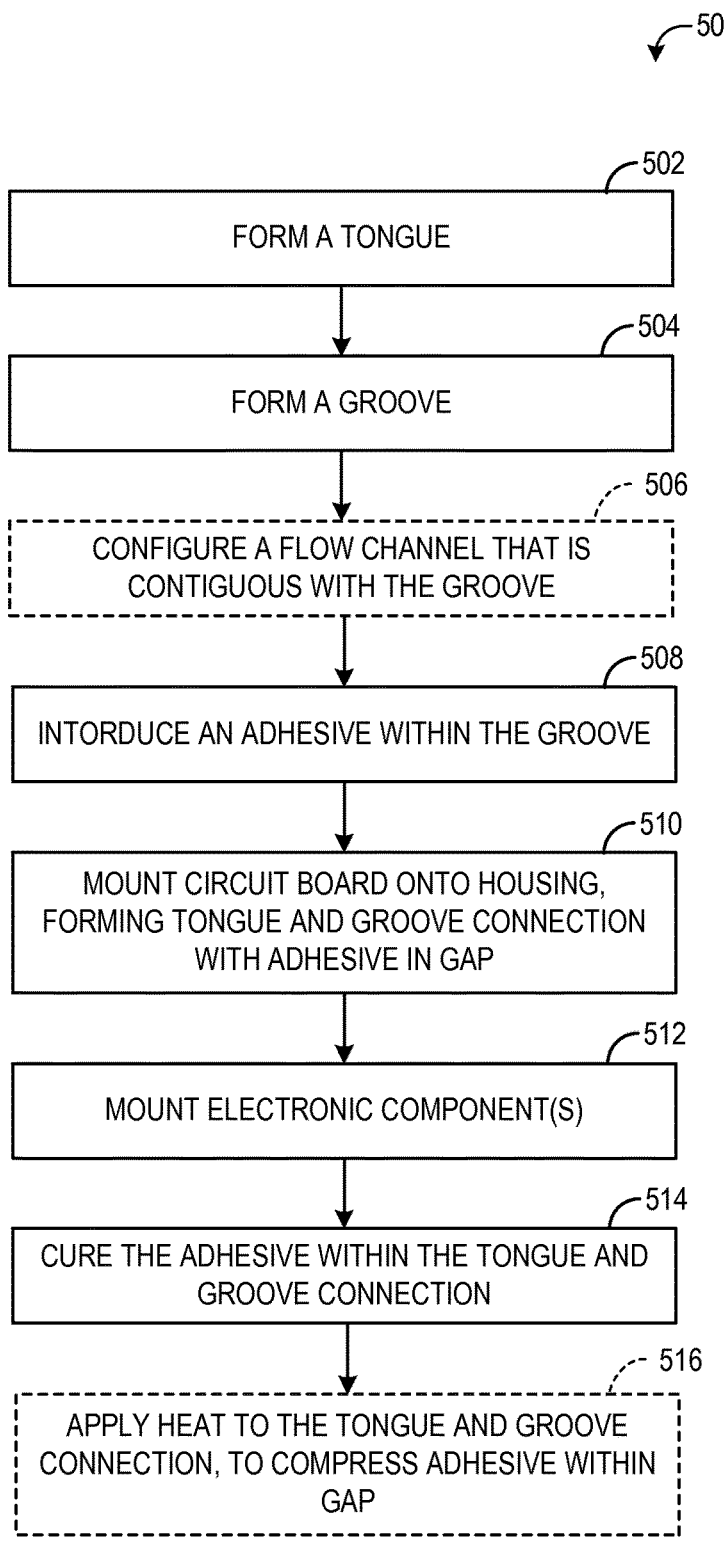
FIG. 5 is a flow chart illustrating an example method for assembling an electronic device including an adhesive joint system.

FIG. 5 illustrates an example of a method 500 for assembling an electronic device including an adhesive joint system. It will be understood that method 500 may be used to mount a circuit board having an electronic component to a housing in an electronic device, as described in the first embodiment or the second embodiment of the present disclosure, for example. At 502, method 500 includes forming a tongue. At 504, method 500 includes forming a groove. The tongue is a protuberance, and the groove is a concavity that is typically has an inner perimeter surface that is formed to correspond in shape to the outer shape of the tongue. The tongue and groove may be sized so as to form a gap between them when they are coupled together. As described above in the first embodiment, the material defining the groove may be in the circuit board, and the tongue may be formed to extend from the housing into the groove. Alternatively, as described above in the second embodiment, the material defining the groove may be in the housing, and the tongue may be formed to extend from the circuit board into the groove. Further, like in the first embodiment, the tongue may be a pin coupled to the housing, or the tongue may be formed integrally with the housing as a single unitary member. Alternatively, as described above in the second embodiment, the tongue may be a pin coupled to the circuit board, or may be formed integrally with the circuit board. Suitable affordances for coupling the pin to the housing or circuit board are described above.

At 506, the method 500 may include a step of configuring a flow channel that is contiguous with the groove so as to accommodate adhesive that is bled out of the groove when the adhesive is compressed in the groove during a manufacturing process or during use. It will be appreciated that the number of flow channels that are configured per groove is not particularly limited—there may be only one per groove, or a plurality of flow channels per groove. In other embodiments of the method, flow channels may not necessarily be configured in the circuit board or the housing.

At 508, the method 500 includes introducing an adhesive to the groove. It will be appreciated that this step may be performed before or after the circuit board is mounted onto the housing, as long as a groove exists in which to introduce the adhesive. For example, the adhesive may be introduced into the groove and then the tongue inserted into the groove to cause the adhesive to flow to fill the gap defined by the tongue and groove, as shown in FIGS. 2B and 3B. Alternatively, the adhesive may be first placed on the tongue, and then introduced into the groove when the tongue is placed inside the groove.

At 510, the method 500 includes mounting a circuit board onto a housing, such that the tongue is disposed within the groove and the adhesive is disposed in a gap between the tongue and groove, thereby forming a tongue and groove connection on a proximal end on a first side of the circuit board. It will be appreciated that this step may also be configured as a process of mounting the housing onto the circuit board, depending on the manufacturing process. The method 500 may further comprise forming a plurality of tongue and groove connections on the first side of the circuit board.

At 512, the method 500 includes mounting at least an electronic component on a distal end on a second side of the circuit board that is opposite the first side. However, it will be appreciated that this step may also be performed prior to mounting the circuit board onto the housing.

At 514, the method 500 includes curing the adhesive within the gap in the tongue and groove connection. At 516, the method 500 includes applying heat to the tongue and groove connection, so that the adhesive is compressed within the gap. In this manner, the tongue may be secured within the groove by the compressive forces applied via the adhesive, thereby inhibiting relative motion between the circuit board (and hence the electronic component(s) mounted to the circuit board) and the housing. In some embodiments, the curing at 514 may be accomplished by the applying of heat at 516. In other cases the curing at 514 may be accomplished in another manner, such as UV curing, etc., and the applying of heat may occur during testing or usage of the device. One example of heat that may be applied during testing or use by the end user is heat generated from powered electrical components in the vicinity of the circuit board, combined with ambient heat from the operating environment.

As described above, the materials defining the tongue, groove, and adhesive are not particularly limited, as long as the respective CTEs of the tongue, adhesive, and material defining the groove are related such that as heat is applied to the tongue and groove connection, the adhesive is compressed within the gap. One embodiment of the method to achieve this is to configure the CTE of the tongue to be greater than the CTE of a material defining the groove, such that as heat is applied to the tongue and groove connection, the adhesive is compressed within the gap. Another embodiment of the method is to configure the CTE of the tongue to be less than the CTE of the material defining the groove, and configuring the CTE of the adhesive to be greater than that of the groove or the tongue, such that as heat is applied to the tongue and groove connection, the gap expands less than the adhesive expands, thereby compressing the adhesive in the gap. In accordance with both embodiments, the adhesive is compressed radially within the gap so as to minimize the tensile force that is applied on the adhesive during a round of thermal cycling.

While the method is described in the context of manufacturing one tongue and groove connection, it will be appreciated that steps 502-516 may be repeated to manufacture a plurality of such tongue and groove connections, to thereby cover additional secure connections between the circuit board and housing, which can inhibit rotational movement relative thereto, and also inhibit lateral movement over a greater area than with a single tongue and groove connection.

FIG. 6 illustrates an example head mounted computing device 610 into which the above described adhesive joint system may be implemented. Head mounted computing device 610 may the form of wearable glasses or goggles, and includes a see-through holographic display 612 that may be configured to visually augment an appearance of a physical environment being viewed by the user through the see-through holographic display. For instance, the see-through holographic display 612 may be configured to present holographic images within the real-world environment seen by the user through the display. Thus, the holographic images may be presented in a user interface overlaying the real-world environment seen through the display.

The head mounted computing device 610 may include an image production system 622 that is configured to display virtual objects to the user with the see-through holographic display 612 mounted to a housing 611 of the head mounted computing device 610. The virtual objects are visually superimposed onto the physical environment so as to be perceived at various depths and locations. It will be appreciated that the virtual objects may be included in a user interface. The head mounted computing device 610 may use stereoscopy to visually place a virtual object at a desired depth by displaying separate images of the virtual object to both of the user's eyes. However, the particular method of imparting a perception of depth to the holograms need not be so limited, as numerous holographic display techniques that provide depth perception have been contemplated.

The head mounted computing device 610 includes an optical sensor system 614 coupled to the housing 611, which may include one or more optical sensors. In one example, the optical sensor system 614 may include an outward facing optical sensor 616 that may be configured to detect the real-world background from a similar vantage point (e.g., line of sight) as observed by the user through the see-through holographic display 612. The optical sensor system 614 may include a variety of additional sensors, such as a depth camera and an RGB camera, which may be a high definition camera or have another resolution.

The head mounted computing device 610 may further include a position sensor system 618 coupled to the housing 611, which may include one or more position sensors such as accelerometer(s), gyroscope(s), magnetometer(s), global positioning system(s), multilateration tracker(s), and/or other sensors that output position sensor information useable as a position, orientation, and/or movement of the relevant sensor. The position sensor system may be mounted to the housing 611 of the head mounted computing device via an adhesive joint system as described above. Thus, housing 611 corresponds to housing 114, 214 described above. The head mounted computing device 610 may include one or a plurality of tongue and groove connections as described above at 107 to mount a position sensor system including a circuit board containing inertial motion sensors and/or the other sensors described above, thereby forming a head mounted computing device adhesive joint system similar to the first and second embodiments described above. The adhesive joint system may be thermally loaded in repeated temperature fluctuation cycles due to changes in ambient heat and also due to heat generated by internal components such as the holographic display 612, image production system 622, optical sensor 614, and the position sensor system 618.

Optical sensor information received from the optical sensor system 614 and/or position sensor information received from position sensor system 618 may be used to determine a user's gaze direction. For instance, sensors, such as optical sensors, may be configured to track a user's eye position and movement to determine a user's gaze direction. In another example, one or more optical sensors (e.g., cameras) spaced away from the head mounted portion of the device may be used to track a user's eye movement to determine a user's gaze direction. However, other suitable techniques for ascertaining the gaze direction may be used. Additionally, the user's gaze direction may be expressed via two points on a line.

Furthermore, the optical sensor information and the position sensor information may be used by the head mounted computing device to perform analysis of the real-world background, such as depth analysis, surface reconstruction, environmental color and lighting analysis, or other suitable operations. For instance, optical sensor information and the position sensor information may be used by the head mounted computing device 610 to identify surfaces in the real-world environment perceived by the optical sensor. As some particular examples, a surface of a wall, ceiling, floor, or object, etc., may be identified by the head mounted computing device 610. Additionally, optical and position sensor information may be used to create a virtual model of the real-world background to enable a virtual object to be generated at desired locations in the real-world environment, for instance.

In one particular embodiment a head mounted computing device may be provided that includes a housing, an image production system coupled to the housing, a position sensing system coupled to the housing, and a see-through holographic display coupled to the housing and configured to display holographic images output from the image production system at locations on the see-though holographic display which are calculated based on a position sensed by the position sensing system. The position sensing system may include a circuit board. In this embodiment, the circuit board may include a distal end and a proximal end mounted on a first side via a tongue and groove connection to the housing, and the tongue and groove connection may include a tongue and a groove and a gap between the tongue and the groove. Further, an adhesive may be positioned at least in the gap surrounding the tongue, and an inertial motion sensor may be mounted to the distal end on a second side of the circuit board that is opposite the first side. Additionally, respective coefficients of thermal expansion of the tongue, adhesive, and material defining the groove may be related such that as heat is applied to the tongue and groove connection, the adhesive is compressed within the gap.

The above described embodiments address the deficiencies of the face to face glue joint described above, and offer the potential advantage of inhibiting thermally induced shear stresses that may adversely affect the sensor package and inhibiting movement of the sensor package relative to the housing over repeated cycles of temperature fluctuations, thereby maintaining a rigid relationship between the positioning of the printed circuit board and sensor and product housing for improved sensor accuracy. In this manner, the performance of electronic devices that use high precision sensors, such as inertial motion sensors for tracking head position in augmented reality head-mounted computing devices, can be improved.

According to one aspect of the present disclosure an adhesive joint system is disclosed, which includes a circuit board including a distal end and a proximal end mounted on a first side via a tongue and groove connection to a housing, the tongue and groove connection including a tongue and a groove and a gap between the tongue and the groove; an adhesive positioned at least in the gap surrounding the tongue; and an electrical component mounted to the distal end on a second side of the circuit board that is opposite the first side. In this aspect, respective coefficients of thermal expansion of the tongue, adhesive, and material defining the groove may be related such that as heat is applied to the tongue and groove connection, the adhesive is compressed within the gap. In this aspect, the electrical component may be an inertial motion sensor. In this aspect, the inertial motion sensor may comprise one of a gyroscope and an accelerometer. In this aspect, the tongue and groove connection may be a first tongue and groove connection; and the housing may be mounted on the first side via a plurality of tongue and groove connections including the first tongue and groove connection. In this aspect, the adhesive joint system may comprise a flow channel that is contiguous with the groove and configured to accommodate adhesive that is bled out of the groove when the adhesive is compressed in the groove. In this aspect, the coefficient of thermal expansion of the tongue may be greater than the coefficient of thermal expansion of a material defining the groove, such that as heat is applied to the tongue and groove connection, the gap narrows, thereby compressing the adhesive in the gap. In this aspect, the coefficient of thermal expansion of the tongue may be less than the coefficient of thermal expansion of the material defining the groove, and the coefficient of thermal expansion of the adhesive may be greater than that of the groove or the tongue, such that as heat is applied to the tongue and groove connection, the gap expands less than the adhesive expands, thereby compressing the adhesive in the gap. In this aspect, the material defining the groove may be in the circuit board, and the tongue may extend from the housing into the groove. In this aspect, the tongue may be a pin coupled to the housing. In this aspect, the tongue may be formed integrally with the housing. In this aspect, the material defining the groove may be in the housing, and the tongue may extend from the circuit board into the groove. In this aspect, the tongue may be a pin coupled to the circuit board. In this aspect, the tongue may be formed integrally with the circuit board. Any or all of the above-described examples may be combined in any suitable manner in various implementations.

According to another aspect of the present disclosure, a method for assembling an electronic device comprising an adhesive joint system is provided, the method including forming a tongue, forming a groove in a material defining the groove, mounting a circuit board onto a housing, such that the tongue is disposed within the groove and an adhesive is disposed in a gap between the tongue and groove, thereby forming a tongue and groove connection on a proximal end on a first side of the circuit board; and mounting at least an electronic component on a distal end on a second side of the circuit board that is opposite the first side; where respective coefficients of thermal expansion of the tongue, adhesive, and material defining the groove are related such that as heat is applied to the tongue and groove connection, the adhesive is compressed within the gap. In this aspect, the method may further comprise configuring the coefficient of thermal expansion of the tongue to be greater than the coefficient of thermal expansion of a material defining the groove, such that as heat is applied to the tongue and groove connection, the gap narrows, thereby compressing the adhesive in the gap. In this aspect, the method may further comprise configuring the coefficient of thermal expansion of the tongue to be less than the coefficient of thermal expansion of the material defining the groove, and configuring the coefficient of thermal expansion of the adhesive to be greater than that of the groove or the tongue, such that as heat is applied to the tongue and groove connection, the gap expands less than the adhesive expands, thereby compressing the adhesive in the gap. In this aspect, the method may further comprise configuring a flow channel that is contiguous with the groove so as to accommodate adhesive that is bled out of the groove when the adhesive is compressed in the groove during a manufacturing process. In this aspect, the material defining the groove may be in the circuit board, and the tongue may be formed to extend from the housing into the groove; and the tongue may be a pin coupled to the housing or is formed integrally with the housing. In this aspect, the material defining the groove may be in the housing, and the tongue may be formed to extend from the circuit board into the groove; and the tongue may be a pin coupled to the circuit board or formed integrally with the circuit board. Any or all of the above-described examples may be combined in any suitable manner in various implementations.

According to another aspect of the present disclosure, a head mounted computing device is disclosed, which includes a housing; an image production system coupled to the housing; a position sensing system coupled to the housing; a see-through holographic display coupled to the housing and configured to display holographic images output from the image production system at locations on the see-though holographic display which are calculated based on a position sensed by the position sensing system; and the position sensing system may include a circuit board; and the circuit board may include a distal end and a proximal end mounted on a first side via a tongue and groove connection to the housing, the tongue and groove connection may include a tongue and a groove and a gap between the tongue and the groove; an adhesive may be positioned at least in the gap surrounding the tongue; and an inertial motion sensor may be mounted to the distal end on a second side of the circuit board that is opposite the first side; and respective coefficients of thermal expansion of the tongue, adhesive, and material defining the groove may be related such that as heat is applied to the tongue and groove connection, the adhesive is compressed within the gap. Any or all of the above-described examples may be combined in any suitable manner in various implementations.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. An adhesive joint system, comprising:
   a circuit board including a distal end and a proximal end mounted on a first side via a tongue and groove connection to a housing, the tongue and groove connection including a tongue and a groove and a gap between the tongue and the groove;
   an adhesive positioned at least in the gap surrounding the tongue;
   an electrical component mounted to the distal end on a second side of the circuit board that is opposite the first side, wherein respective coefficients of thermal expansion of the tongue, adhesive, and material defining the groove are related such that as heat is applied to the tongue and groove connection, the adhesive is compressed within the gap; and
   a flow channel that is contiguous with the groove and configured to accommodate adhesive that is bled out of the groove when the adhesive is compressed in the groove.

2. The adhesive joint system of claim 1, wherein the electrical component is an inertial motion sensor.

3. The adhesive joint system of claim 1, wherein the tongue and groove connection is a first tongue and groove connection; and
   the housing is mounted on the first side via a plurality of tongue and groove connections including the first tongue and groove connection.

4. The adhesive joint system of claim 1, wherein the coefficient of thermal expansion of the tongue is greater than the coefficient of thermal expansion of a material defining the groove, such that as heat is applied to the tongue and groove connection, the gap narrows, thereby compressing the adhesive in the gap.

5. The adhesive joint system of claim 1, wherein the coefficient of thermal expansion of the tongue is less than the coefficient of thermal expansion of the material defining the groove, and the coefficient of thermal expansion of the adhesive is greater than that of the groove or the tongue, such that as heat is applied to the tongue and groove connection, the gap expands less than the adhesive expands, thereby compressing the adhesive in the gap.

6. The adhesive joint system of claim 1, wherein the material defining the groove is in the circuit board, and the tongue extends from the housing into the groove.

7. The adhesive joint system of claim 1, wherein the material defining the groove is in the housing, and the tongue extends from the circuit board into the groove.

8. The adhesive joint system of claim 2, wherein the inertial motion sensor comprises one of a gyroscope and an accelerometer.

9. The adhesive joint system of claim 6, wherein the tongue is a pin coupled to the housing.

10. The adhesive joint system of claim 6, wherein the tongue is formed integrally with the housing.

11. The adhesive joint system of claim 7, wherein the tongue is a pin coupled to the circuit board.

12. The adhesive joint system of claim 7, wherein the tongue is formed integrally with the circuit board.

13. A method for assembling an electronic device comprising an adhesive joint system, the method comprising:
   forming a tongue;
   forming a groove in a material defining the groove;
   mounting a circuit board onto a housing, such that the tongue is disposed within the groove and an adhesive is disposed in a gap between the tongue and groove, thereby forming a tongue and groove connection on a proximal end on a first side of the circuit board; and
   mounting at least an electronic component on a distal end on a second side of the circuit board that is opposite the first side;
   wherein respective coefficients of thermal expansion of the tongue, adhesive, and material defining the groove are related such that as heat is applied to the tongue and groove connection, the adhesive is compressed within the gap, and
   configuring a flow channel that is contiguous with the groove so as to accommodate adhesive that is bled out of the groove when the adhesive is compressed in the groove during a manufacturing process.

14. The method of claim 13, further comprising:
   configuring the coefficient of thermal expansion of the tongue to be greater than the coefficient of thermal expansion of a material defining the groove, such that as heat is applied to the tongue and groove connection, the gap narrows, thereby compressing the adhesive in the gap.

15. The method of claim 14, further comprising:
   configuring the coefficient of thermal expansion of the tongue to be less than the coefficient of thermal expansion of the material defining the groove, and configuring the coefficient of thermal expansion of the adhesive to be greater than that of the groove or the tongue, such that as heat is applied to the tongue and groove connection, the gap expands less than the adhesive expands, thereby compressing the adhesive in the gap.

16. The method of claim 14, wherein
   the material defining the groove is in the circuit board, and the tongue is formed to extend from the housing into the groove; and
   the tongue is a pin coupled to the housing or is formed integrally with the housing.

17. The method of claim 14, wherein
   the material defining the groove is in the housing, and the tongue is formed to extend from the circuit board into the groove; and
   the tongue is a pin coupled to the circuit board or is formed integrally with the circuit board.

18. A head mounted computing device, comprising: a housing;
   an image production system coupled to the housing;
   a position sensing system coupled to the housing;
   a see-through holographic display coupled to the housing and configured to display holographic images output from the image production system at locations on the see-though holographic display which are calculated based on a position sensed by the position sensing system; and wherein the position sensing system includes a circuit board; and wherein the circuit board includes a distal end and a proximal end mounted on a first side via a tongue and groove connection to the housing, the tongue and groove connection including a tongue and a groove and a gap between the tongue and the groove;

wherein an adhesive is positioned at least in the gap surrounding the tongue; and wherein an inertial motion sensor is mounted to the distal end on a second side of the circuit board that is opposite the first side; and wherein respective coefficients of thermal expansion of the tongue, adhesive, and material defining the groove are related such that as heat is applied to the tongue and groove connection, the adhesive is compressed within the gap, and a flow channel is contiguous with the groove so as to accommodate adhesive that is bled out of the groove when the adhesive is compressed in the groove.

\* \* \* \* \*